United States Patent
Wang et al.

(10) Patent No.: US 7,164,561 B2
(45) Date of Patent: Jan. 16, 2007

(54) VOLTAGE REGULATOR USING PROTECTED LOW VOLTAGE DEVICES

(75) Inventors: Yongliang Wang, Saratoga, CA (US); John Pasternak, Santa Clara, CA (US)

(73) Assignee: Sandisk Corporation, Milpitas, CA (US)

(*) Notice: Subject to any disclaimer, the term of this patent is extended or adjusted under 35 U.S.C. 154(b) by 197 days.

(21) Appl. No.: 10/814,518

(22) Filed: Mar. 31, 2004

(65) Prior Publication Data

US 2005/0179421 A1 Aug. 18, 2005

Related U.S. Application Data

(60) Provisional application No. 60/544,750, filed on Feb. 13, 2004.

(51) Int. Cl.
*H02H 3/20* (2006.01)

(52) U.S. Cl. .................................. 361/18; 323/282
(58) Field of Classification Search ............... 323/282, 323/284, 285, 299; 361/18
See application file for complete search history.

(56) References Cited

U.S. PATENT DOCUMENTS

| | | | |
|---|---|---|---|
| 3,992,650 A * | 11/1976 | Iwasa et al. ................. 361/101 |
| 4,373,117 A | 2/1983 | Pierce |
| 4,566,052 A * | 1/1986 | Kammiller ................... 361/18 |
| 5,121,007 A | 6/1992 | Aizaki |
| 5,327,388 A | 7/1994 | Kobayashi |
| 5,329,491 A | 7/1994 | Brown et al. |
| 5,359,281 A * | 10/1994 | Barrow et al. ............... 323/284 |
| 5,373,477 A | 12/1994 | Sugibayashi |
| 5,490,117 A | 2/1996 | Oda et al. |
| 5,566,121 A | 10/1996 | Hadderman et al. |
| 5,602,462 A | 2/1997 | Stich et al. |
| 5,615,328 A | 3/1997 | Hadderman et al. |
| 5,625,280 A | 4/1997 | Voldman |
| 5,632,039 A | 5/1997 | Walker et al. |
| 5,696,465 A | 12/1997 | Ishizuka |
| 5,814,980 A | 9/1998 | Lewis |
| 5,818,781 A | 10/1998 | Estakhri et al. |
| 5,894,244 A | 4/1999 | Ukita |
| 5,903,501 A | 5/1999 | Kurosaki |
| 5,909,586 A | 6/1999 | Anderson |
| 5,973,483 A * | 10/1999 | Jo ............................... 323/222 |
| 5,973,521 A | 10/1999 | Kim et al. |
| 6,028,755 A * | 2/2000 | Saeki et al. ................. 361/91.1 |
| 6,163,170 A | 12/2000 | Takinomi |
| 6,181,118 B1 | 1/2001 | Meehan et al. |
| 6,185,082 B1 * | 2/2001 | Yang ............................ 361/90 |
| 6,198,683 B1 | 3/2001 | Ishii et al. |
| 6,420,924 B1 | 7/2002 | Lundberg |

(Continued)

*Primary Examiner*—Jeffrey Sterrett
(74) *Attorney, Agent, or Firm*—Vierra Magen Marcus & DeNiro LLP (57) ABSTRACT

A step down voltage regulator including devices designed to operate over a maximum rated voltage lower than the supply voltage. The regulator comprises an output regulation device coupled to the supply voltage and an output; and an output device protection circuit responsive to the supply voltage and the output to ensure that the maximum rated voltage of the output device is not exceeded. Also provided is a method for operating a voltage regulator in a memory system. The method includes the steps of: providing a voltage regulator having an input and an output, and including a plurality of devices operating at a maximum rated voltage less than the voltage provided at the input; and controlling the gate voltage of the output device responsive to a load on the regulator output, so that the maximum rated voltage is not exceeded.

45 Claims, 6 Drawing Sheets

U.S. PATENT DOCUMENTS 6,462,992 B1 10/2002 Harari et al.
6,674,657 B1 * 1/2004 Nagaya et al. ................ 363/50
2002/0157039 A1 10/2002 Ihara
2003/0132733 A1 7/2003 Hijikata

* cited by examiner

Fig. 6

VOLTAGE REGULATOR USING PROTECTED LOW VOLTAGE DEVICES

CLAIM OF PRIORITY

This application claims the benefit of U.S. Provisional Application No. 60/544,750, "Voltage Regulator Using Protected Low Voltage Devices," filed on Feb. 13, 2004, incorporated herein by reference.

BACKGROUND OF THE INVENTION

1. Field of the Invention

The present invention is directed to voltage regulation in multivoltage supply applications, and in particular, for peripheral devices such as memory systems.

2. Description of the Related Art

Advances in integrated circuit (IC) technology often relate to decreasing the size and operating voltages of devices used to fabricate circuitry. Lower power devices generally translate into lower costs due to decreases in circuit size and power consumption. Currently, low-voltage integrated circuits having transistors operating in the three-volt range and lower are highly desirable. The three-volt ICs are gradually replacing the standard five-volt ICs due to their higher speed and higher integration densities. Moreover, the three-volt ICs consume less power than the traditional five-volt ICs. In battery operated devices, such as portable telephones and lap-top computers, low-voltage integrated circuits allows the devices to operate proportionally longer than devices requiring higher voltage for operation.

Improvements in processing technology have led to smaller transistor device sizes. This in turn has led to lower power supply requirements in each successive generation of transistor technology. For example, a 0.25 micron process device operates on a voltage of approximately 2.5 volts, a 0.18 micron process uses a 1.8 v (+/−10%) supply, a 0.15 micron process will use a 1.5 (+/−10%) volt supply, 0.13 micron technology a 1.2 v (+/−10%) supply, and so on.

The lower power requirements of newer semiconductor processes are not always compatible with legacy host devices. For example, older hosts may supply 5 or 3 volts to a memory system requiring only 3 or 1.8 volts, respectively. Computer peripheral devices must therefore be designed to accommodate connections from both 3.3 volt host supplies as well as older, higher voltage supplies. Devices constructed with newer technologies therefore allow for the possibility that the host device in which they are used will supply a higher voltage used with legacy products. Hence power level detection and voltage regulation techniques are used to provide the correct voltage to the memory device.

One such peripheral device which must make such adjustments is non-volatile memory which might be used in cellular telephones, digital cameras, personal digital assistants, mobile computing devices, non-mobile computing devices, audio and video players and other appliances. Electrical Erasable Programmable Read Only Memory (EEPROM) and flash memory are among the most popular non-volatile semiconductor memory types.

Typical applications include the provision of one more arrays of storage elements in a memory card system, such as a memory card, which is then inserted in a host device. Both EEPROM and flash memory utilize arrays of storage elements to store one or more bits of data per element. Each element generally includes a floating gate that is positioned above and insulated from a channel region and a semiconductor substrate. The floating gate is positioned between source and drain regions. A control gate may be provided over and insulated from a floating gate. The threshold voltage of each memory transistor is controlled by the amount of charge that has retained on the floating gate. That is, the minimum amount of voltage that must be applied to the control gate before a transistor is turned on to permit conduction between its source entering is controlled by the level of charge on the floating gate. Many EEPROMs and flash memories have a floating gate that is used to store two ranges of charges and, therefore, the memory cell can be programmed/erased between two states. Such memory cells store one byte of data. Other EEPROMs and flash memory cells store multiple ranges of charge and, therefore, such memory cells can be programmed to store multiple states. Such memory cells store multiple bytes of data.

Non-volatile memory may be coupled to a host device in a number of ways. Peripheral adapters include integrated adapters coupled directly to a computers system bus and power supply, and peripherals adapted to connect to any of a number of industry standard external system connections, such as Universal Serial Bus or the IEEE 1394 Standard. These standard connections generally include a power and ground connection for the peripheral. Again, older connections provide a 5 v supply, not generally suited for newer peripherals with lower voltage transistors.

Generally, in order to couple peripherals manufactured with newer process technologies to legacy or hosts providing higher-supply voltages, step-down voltage regulators are used. Where the regulator is integrated with the peripheral, it would be desirable to manufacture the regulator using the same process technology as that used to manufacture devices in the peripheral. Generally, however, this is not possible, since the input load to the regulator can damage lower voltage devices.

The present invention solves the problem of using lower voltage devices with input voltages exceeding the maximum rated voltages of devices used in the voltage regulator.

SUMMARY OF THE INVENTION

The present invention, roughly described, pertains to a step down voltage regulator including devices designed to operate over a maximum rated voltage lower than the supply voltage. The regulator comprises an output regulation device coupled to the supply voltage and an output; and an output device protection circuit responsive to the supply voltage and the output to ensure that the maximum rated voltage of the output device is not exceeded.

In a second embodiment, the invention is a voltage regulator supplying an output voltage lower than a supply voltage. The regulator includes an output device designed to operate at a maximum rated voltage lower than the supply voltage. An output device protection circuit is also provided. It regulates a gate voltage of the output device relative to a output load and a source voltage on the output device so as to not exceed the maximum rated voltage.

In yet another embodiment, the invention is a memory system including a control path and a data path to a host device, and receiving a supply voltage from the host device. The memory system includes a voltage regulator including a voltage input coupled to the supply voltage, and an output device operating at a maximum rated voltage less than the supply voltage and coupled to a regulator output. Also included in the regulator is a protection circuit coupled to the voltage input and the output device, including an output device gate control, the protection circuit comprising a plurality of output control devices operating at maximum rated voltages less than the voltage provided by the host at the input.

In a further embodiment, the invention is a method for operating a voltage regulator in a memory system. The method includes the steps of: providing a voltage regulator having an input and an output, and including a plurality of devices operating at a maximum rated voltage less than the voltage provided at the input; and controlling the gate voltage of the output device responsive to a load on the regulator output, so that the maximum rated voltage is not exceeded.

In another embodiment, the invention is a peripheral device for a host system including a voltage regulator circuit. The peripheral device includes a functional component, and a voltage regulator having an supply voltage input and an output. In addition, the regulator includes an output regulation device coupled to the supply voltage and the output, and an output device protection circuit responsive to the supply voltage and the output to ensure that the maximum rated voltage of the output device is not exceeded.

In yet another embodiment, the invention is a memory system including a controller and a memory array. The system further includes a voltage regulator including a plurality of devices operating at maximum rated voltages less than a supply voltage and having an output regulation device coupled to the supply voltage and an output, and an output device protection circuit responsive to the supply voltage and the output to ensure that the maximum rated voltage of the output device is not exceeded.

These and other objects and advantages of the present invention will appear more clearly from the following description in which the preferred embodiment of the invention has been set forth in conjunction with the drawings.

BRIEF DESCRIPTION OF THE DRAWINGS

The invention will be described with respect to the particular embodiments thereof. Other objects, features, and advantages of the invention will become apparent with reference to the specification and drawings in which.

DETAILED DESCRIPTION

The invention allows fabrication of voltage regulation devices using transistors or other devices which are designed to operate at maximum rated voltages lower than the supply voltage of the host. The invention thus allows computer peripheral manufactures to build peripherals incorporating regulators using devices made with the same process technology as other components of the peripheral, even where such process creates devices with lower operating voltages. The invention ensures that the potentially higher supply voltages of older hosts do not damage the peripheral or the voltage regulator.

In one embodiment, the invention is suitable for use with a non-volatile memory system. However, the invention has myriad uses not limited to memory systems. The system may be utilized with any number of types of host devices such as cellular telephones, digital cameras, personal digital assistants, mobile computing devices, non-mobile computing devices and other devices. One typical host device is a computer system. It should be recognized that the system shown in FIG. 1 is exemplary and any number of devices may serve as hosts for the peripheral, including digital cameras, music players, computers, and the like.

Figure 1:
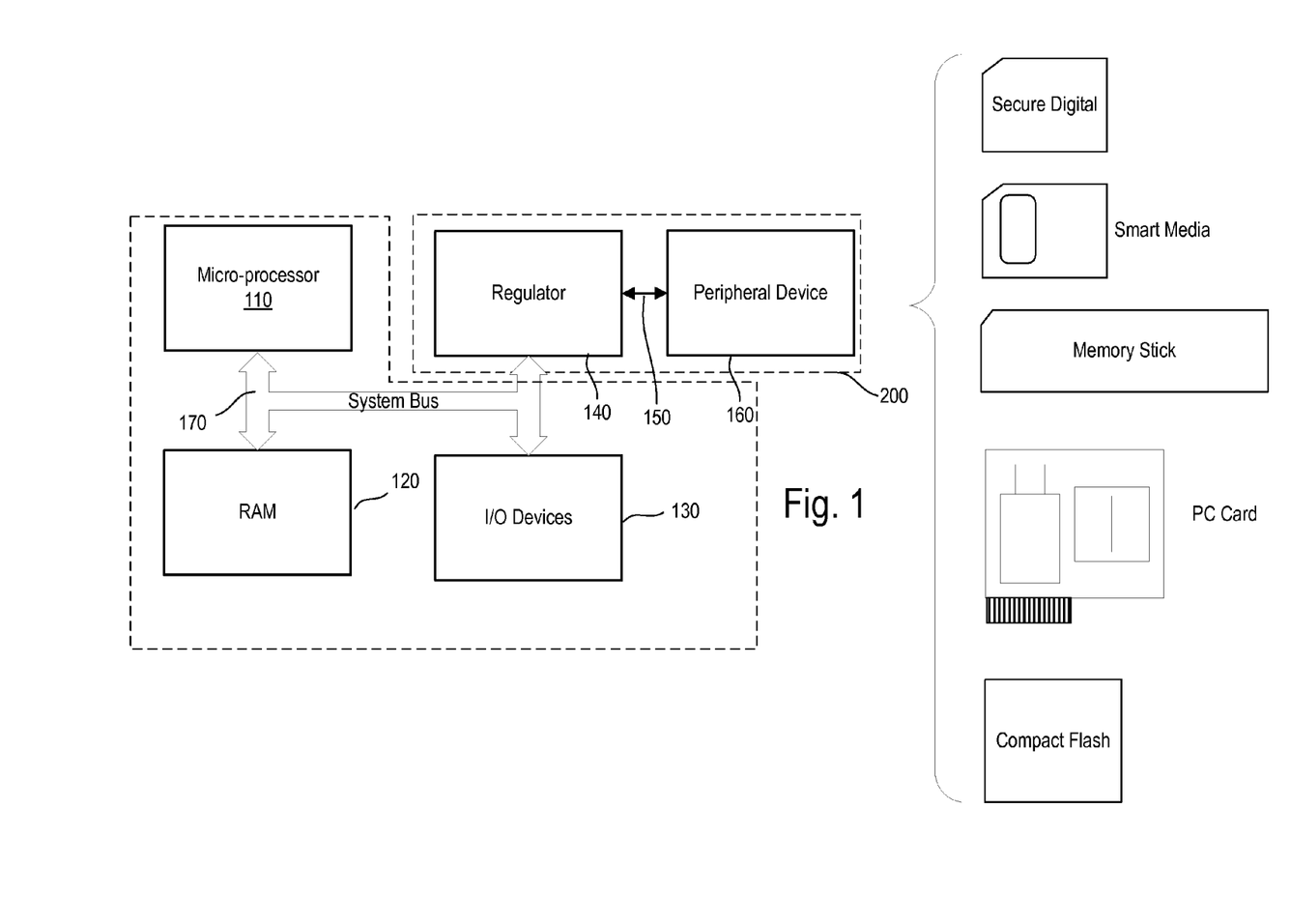
FIG. 1 depicts a general-purpose computer system which may constitute a host for a peripheral device incorporating the techniques of the present invention.

An exemplary general purpose computer system which may server as a host and in which the various aspects of the present invention may be incorporated is illustrated generally in FIG. 1. A typical computer system architecture includes a microprocessor 110 connected to a system bus 170, along with random access, main system memory 120, and at least one or more input-output devices 130, such as a keyboard, monitor, modem, and the like. Generally, one or more non-volatile storage systems are coupled to the system bus 170 as well. Typically, such a memory is a disk drive and the data stored thereon is retrieved into the system volatile memory 120 for use in current processing, and can be easily supplemented, changed or altered.

A peripheral device 200 is also coupled to the computer. The peripheral may be coupled to receive data signals from the system bus 170, and a power supply voltage from the computer's power supply (not shown). The peripheral includes a voltage regulator 140 providing regulated power to a functional component 160, such as a memory card, of the peripheral device 200. In one example, where the peripheral is a storage memory system, the system may be constructed of a memory controller, connected to the computer system bus, and a memory array, which may be comprised of EEPROM integrated circuit chips. Where the peripheral is a memory system, the controller is preferably formed primarily on a single integrated circuit chip and the memory array may include a number of EEPROM integrated circuit chips. The memory system may be provided in the form of a pc card, a compact flash card, a secure digital card, a smart media card, a memory stick, or other physical forms. Data and instructions are communicated from the computer to the peripheral device over a data line.

Figure 2:
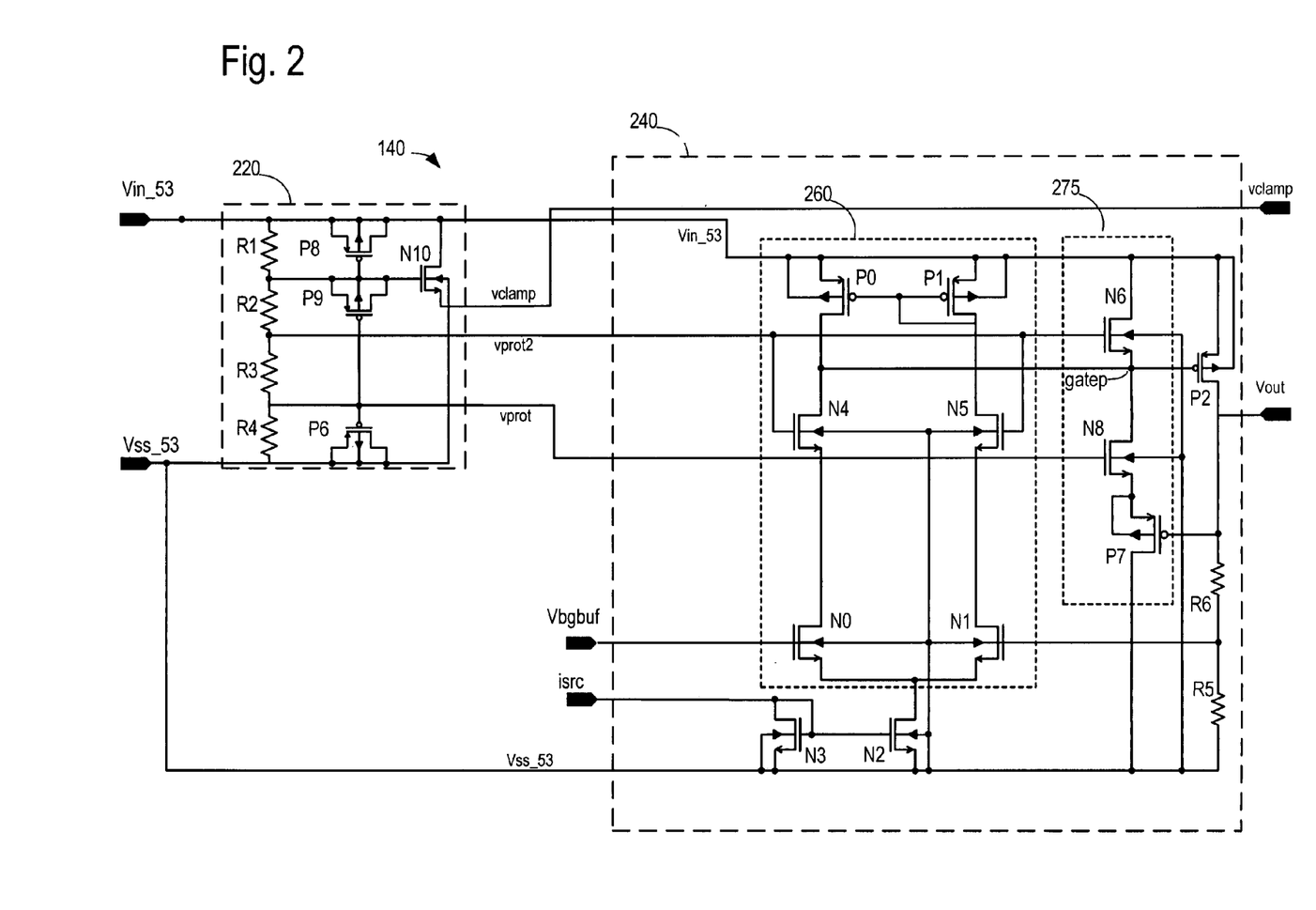
FIG. 2 is a schematic diagram of a voltage regulator formed in accordance with the present invention.

FIG. 2 is a schematic diagram of the voltage regulator 140 in accordance with the present invention. The regulator 140 includes a clamp circuit 220 and a regulator circuit 240. Regulator 140 receives as input voltage Vin_53 and Vss_53 which are provided by the host device or other voltage source. In general Vin_53 will be in a range of approximately 4.4 volts to 5.25 volts, while Vss_53 will be at ground. Also shown in FIG. 2 which are the band gap buffer voltage Vbgbuf and a bias current. Vbgbuf may be generated by the peripheral device and will have a range of between 1.3 and 1.5 volts., while Isrc provides approximately 2.5 microamps.

Clamp circuit 220 includes a resistive divider and capacitive divider which provide three outputs: Vclamp is an unregulated analog ouput voltage in the range of 3.3 volts, and Vprot and Vprot2 which are two "protect" voltages used by the regulator circuit to provide protection for the active devices therein. Vclamp is allowed to pass through to the peripheral device for use in unregulated analog power needs.

All transistors in the circuit shown in FIG. 2 are "3 volt" devices. That is, each of the transistors has a maximum rated operating voltage of 3.6 volts. In accordance with the foregoing description, to reduce the maximum rated voltages, transistor designers have altered channel lengths and reduced oxide thicknesses. Were the supply voltage of Vin_53 at a level between 4.4 and 5.3 volts allowed to impact the gates of the devices directly, damage to the devices would result. Hence, the circuit of the present invention utilizes a protection scheme for each of the elements in the circuit, as well as the critical output device P2 shown in FIG. 2, to insure that the 3 volt devices used in the regulator are not damaged by the higher input voltage. As will be readily recognized by one of average skill in the art, this protection scheme can be extended beyond the 5 volt step-down to 3 volt relationship, to other applications.

Clamp circuit 220 comprises a resistive divider made up of resistors R1 through R4 and a capacitive divider made up of p-channel MOSFETs P6, P8, and P9. The capacitive divider allows the three outputs Vprot, Vprot 2 and Vclamp to be provided at the same time to the regulator circuit 240. In one embodiment, resistor R1 has a value of 125 kohms, resistor R2 has a value of 50 kohms, resistor R3 a value of 60 kohms, and resistor R4 a value of 290 kohms. P-channel MOSFET P8 has a commonly coupled base, source and drain, as does device P9, with the gate of device P8 coupled to the base of device P9 with the gate coupled to the gate of device p6 and the tap between resistors R3 and R4. The base, source and drain of P6 are coupled to Vss_53, and the base of ouput transistor N1. Device N1 has a drain coupled to Vin_53, and its a gate coupled to the tap between resistors R1 and R2.

The clamp circuit operates with a current of 10 microamps, and the outputs of vprot and Vprot2 are provided by the outputs of the resistive divider as should be well understood by one of average skill. Vclamp is provided by the controlled voltage enabling the voltage across N10 provided by the tap between resistors R1 and R2.

Since power provided from Vin_53 ramps very rapidly, the capacitive divider coupled MOSFETS P6, P8 and P9 responds to protect gate stress on transistor N10 and ensure that Vprot, Vprot2 and Vin_53 are delivered concurrently. The gate voltage at N10 is in a range of about 3.3–4 volts, with the drain voltage at 4.4–5.5 volts. When Vin_53 is 4.4 volts, the output of Vclamp will be approximately 2.86 volts and Vprot will be 2.43 volts. When Vin_53 is 5.2 volts, Vclamp will be 3.43 volts and Vprot will be 2.9 volts. FIGS. 3 through 6 show the relationship between Vin_53, Vprot, Vprot2 and the output of the regulator circuit 240.

Regulator stage 240 is comprised of a differential pair 260 and a output protection circuit 275. The output protection circuit is coupled to an output regulation device P2. In accordance with the present invention, the protection circuit 275 controls the voltage at node gateP to ensure that the maximum rated voltage of transistor P2 is not exceeded. Since all of the devices in the differential pair circuit 260 and protection circuit 275, all such devices must be protected from excessive voltage across the devices as well.

Device P2 is a p-channel MOSFET having its base and source coupled to Vin_53, and a drain providing the output Vout of the regulator. It too, has a maximum rated voltage of approximately 3.6 volts and because it is the output device, is key to ensuring reliability in the regulator. Differential pair circuit 260 includes n-channel MOSFETS N4 and N5, n-channel MOSFETS N0, N1, and p-channel MOSFETS p0 and p1. The drain of transistor N4 provides the voltage which controls the output device P2 at node gateP. Devices N1, N0, N4 and N5 have commonly coupled bases with the gates of transistors N4 and N5 coupled to Vprot2. The bases and sources of transistors P0 and P1 are coupled to Vin_53, their gates coupled in common. Because transistors P0 and P1 are coupled in a diode configuration, with commonly coupled gates, their source to gate voltage is self-protecting. The output of Vprot will generally be in a range of 2.4 to 2.9 volts. P0 is protected by P1 due to the fact that they share the same gate.

Transistors N4 and N5 each have gates coupled to Vprot2, thereby enduring that the voltage across the gate-source and gate drain interfaces in transistors N4 and N5 is sitting in the relative middle between the Vin_53 and Vss_53. Transistors N0 and N1, each having bases coupled to Vss_53, sources coupled to the current generator N2, and drains coupled to the source of N4 and N5, are protected by transistors N4 and N5. Transistors N2 and N3 provide a bias current for the differential pair circuit 260.

As noted above, transistor P2 is the output transistor of the regulator 240. Hence the source of P2 is connected to Vin_53 and its drain provides the output Vout. Its drain output is also connected to provide a output feedback via resistor divider comprised of resistors R6 and R5 who nominal values of 190 k ohms and 140 k ohms. The protection circuit 275 is comprised of N channel transistors N8 and N6, and P channel transistor P7. In general, the protection circuit 275 insures that as the input voltage Vin_53 ramps, the node gateP cannot be pulled too high or too low to damage P2. In order to accomplish this, the protection circuit ensures that the voltage on gate of the output transistor P2 can never be lower than Vin_53 minus 3.6 volts (the voltage of the devices in the circuit shown in FIG. 2). In a worst case scenario—where no load is provided at Vout—the voltage between the gate of transistor P2 (gate P) and the output voltage will never be greater than 3.6 volts.

Transistor N6 protects P2 from excess voltage across its gate-source interface. Devices N8 and P7 protect P2 from excess voltage across its gate-drain interface. N8 has a gate controlled by Vprot, and a source coupled to the source of P7. P7 has a gate controlled by feedback from Vout. N6 has a gate controlled by Vprot2.

Figure 3:
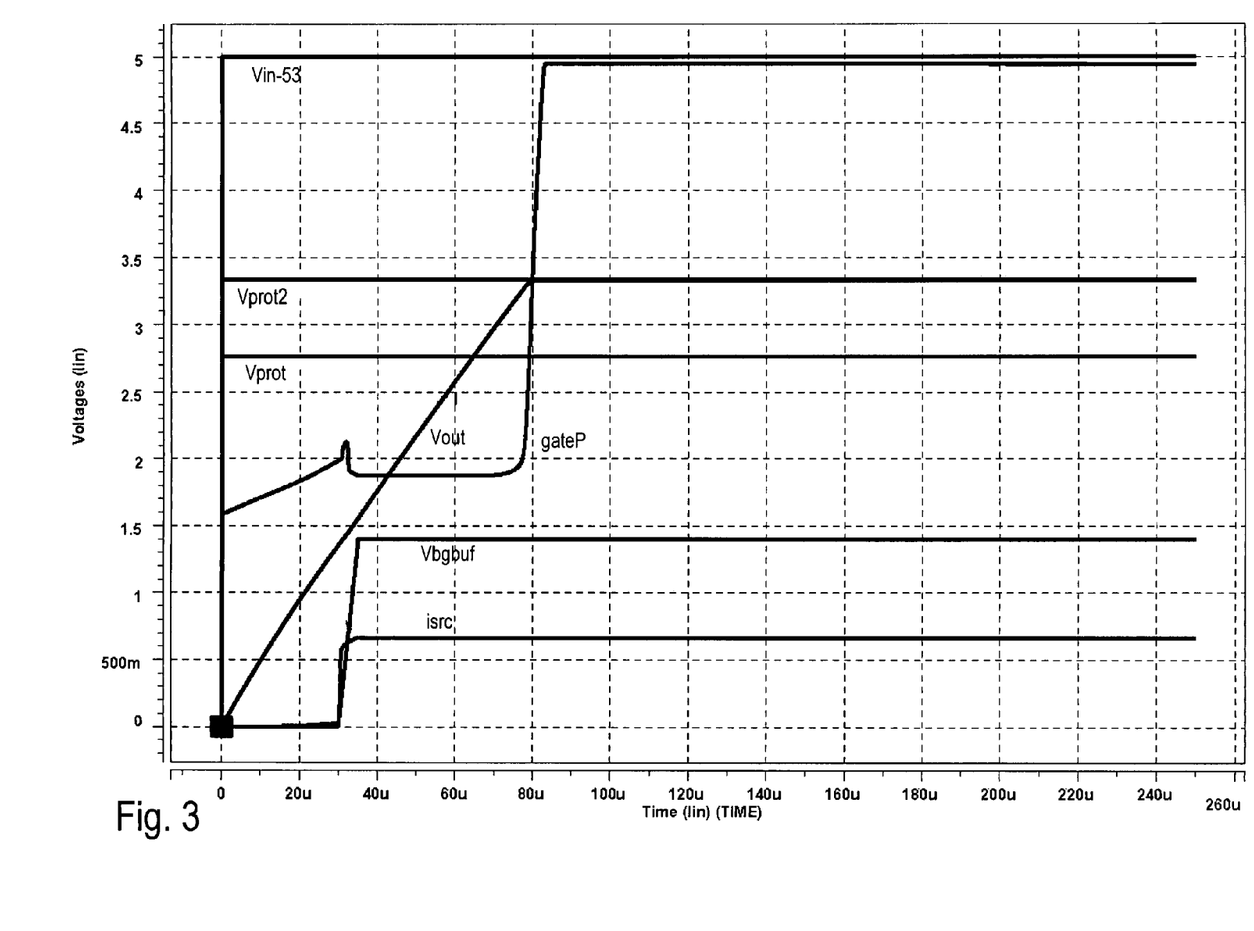
FIG. 3 is a simulation of voltages applied to various nodes of the circuit of FIG. 2 with respect to time showing a minimum output load.
Figure 4:
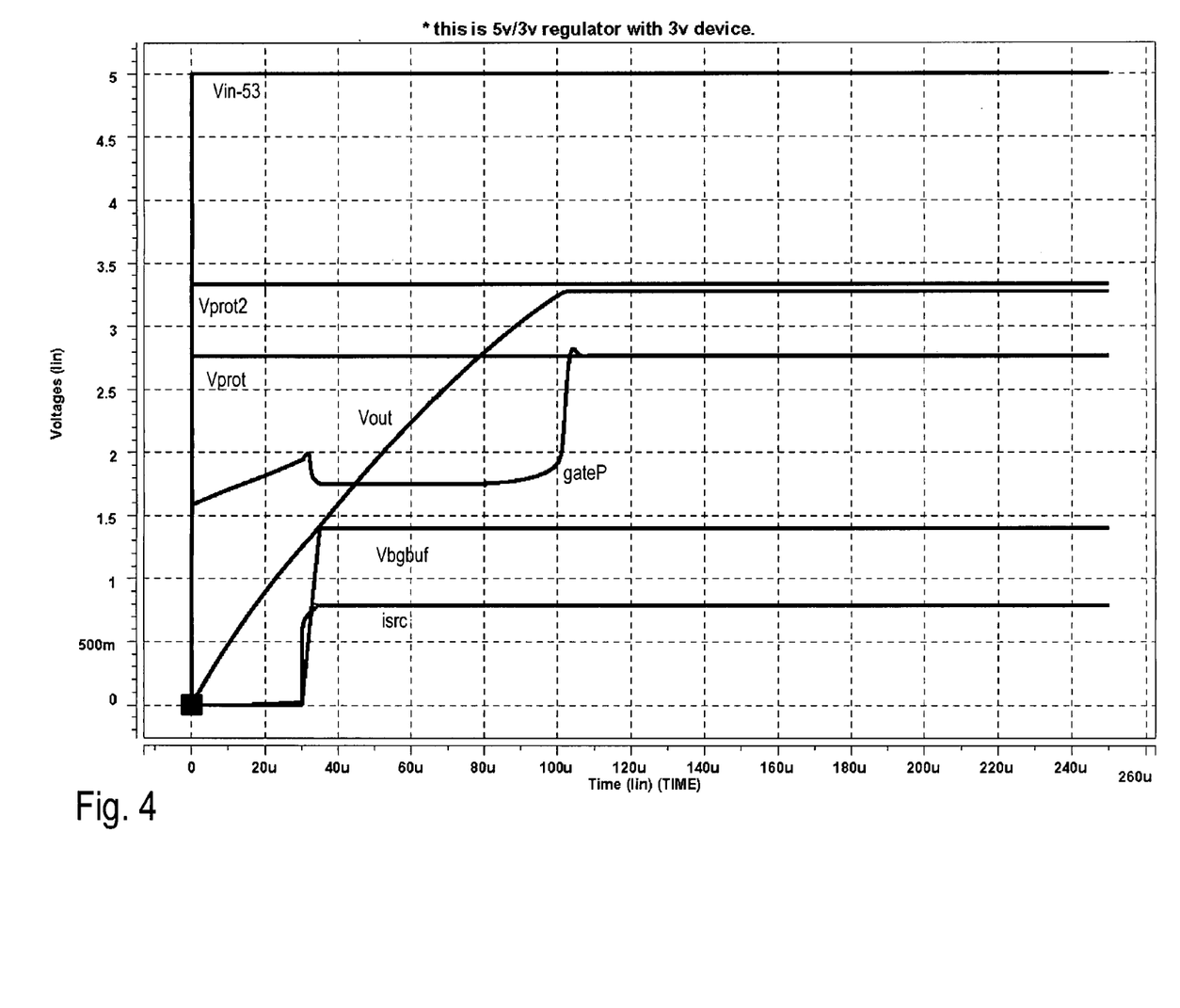
FIG. 4 is a simulation of voltages applied to various nodes of the circuit of FIG. 2 with respect to time showing a maximum output load.

FIGS. 3 and 4 demonstrate the manner in which the protection circuit 275 controls the ramping at gateP, and hence protects the gate-to-drain, and gate-to-source voltages of transistor P2. FIGS. 3 and 4 are simulations of the signals present at various nodes shown with respect to FIG. 2. The difference between FIGS. 3 and 4 is the loading of Vout.

As shown in FIG. 3, the input voltage Vin_53 and the protection voltages Vprot and Vprot 2 will ramp up very quickly. As these voltages are delivered, the node at gateP will also rise quickly since transistor N6 and N8 will be on and along with the pchannel transistor P7. P7 will shut off as Vout reaches P7's maximum rated threshold.

In FIG. 3, Vout peaks at 80 microseconds, while in FIG. 4, it peaks at approximately 105 microseconds. GateP must remain below the maximum rated voltage of P2 until the regulated output of 3 volts at Vout is reached. As gateP ramps to 1.6 v, its rise time will be hindered by the path of N8 and P7. Because this path is on, it will hold down gateP. Hence, during a condition where no load is present on Vout, the presence of N8 and P7 insure that the load at gate P will not be pulled to the high voltage rail before the output voltage reaches its desired level. Once the output reaches 3.3 volts, P7 shuts off and gateP is allowed to continue to rise. With gateP at approximately 4.9 volts, the voltage between the gate and drain will still be only 1.3 volts.

In the case of FIG. 4, where the output voltage rises more slowly, the conduction path between gate P and the negative rail will again be allowed to continue until the maximum rated voltage of transistor P7 is achieved. A potential problem with this situation is that gateP cannot remain too low without risking damage to the gate-source interface. N6 allows the voltage at gate P to hold at 1.7 volts after the conduction path of P7 is terminated. Nevertheless, the voltage between the source of transistor P2 and gateP will never exceed 3.6 volts.

Figure 5:
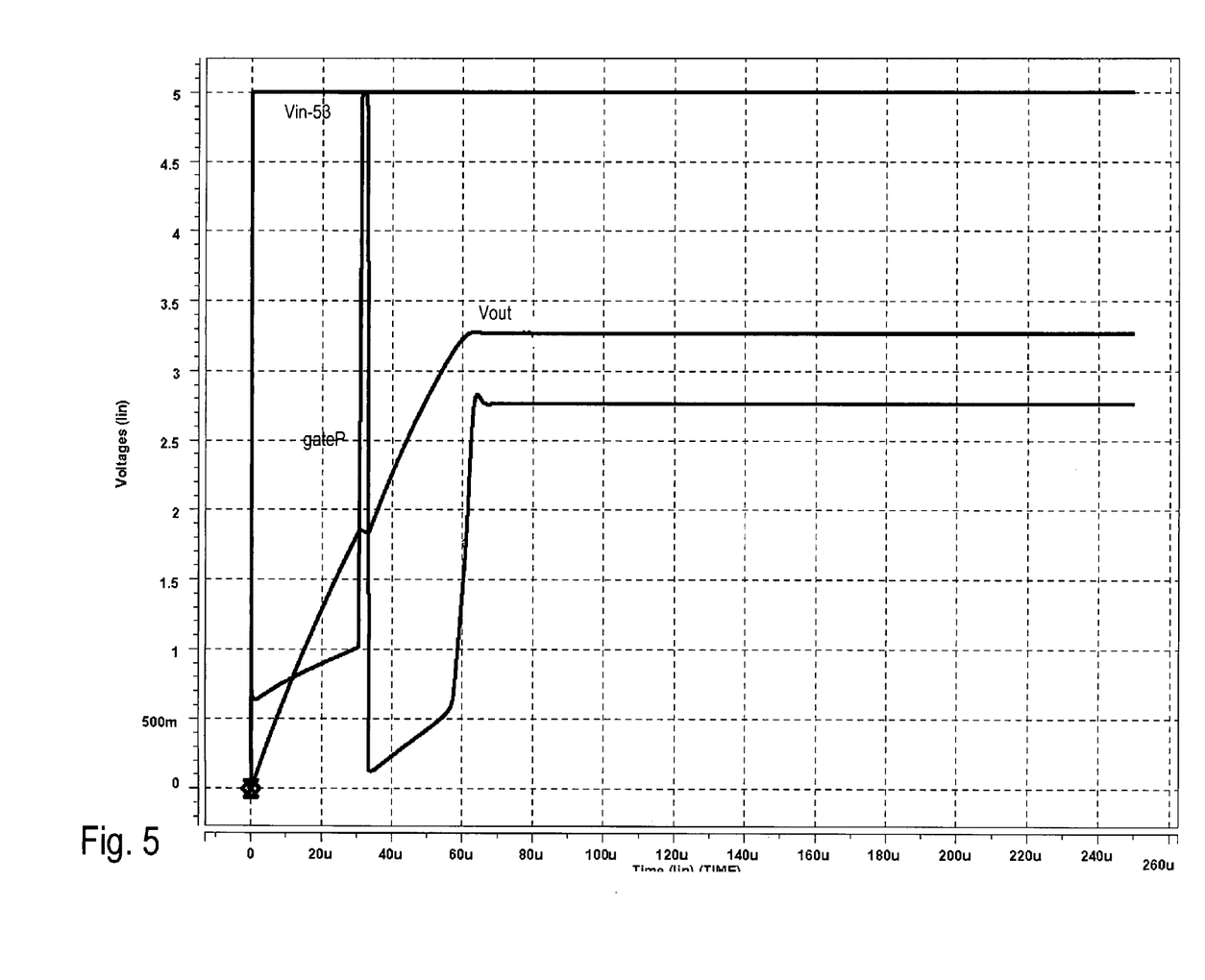
FIG. 5 is a simulation similar to FIG. 4 showing the effect of removing the gate-source protection of the output device.
Figure 6:
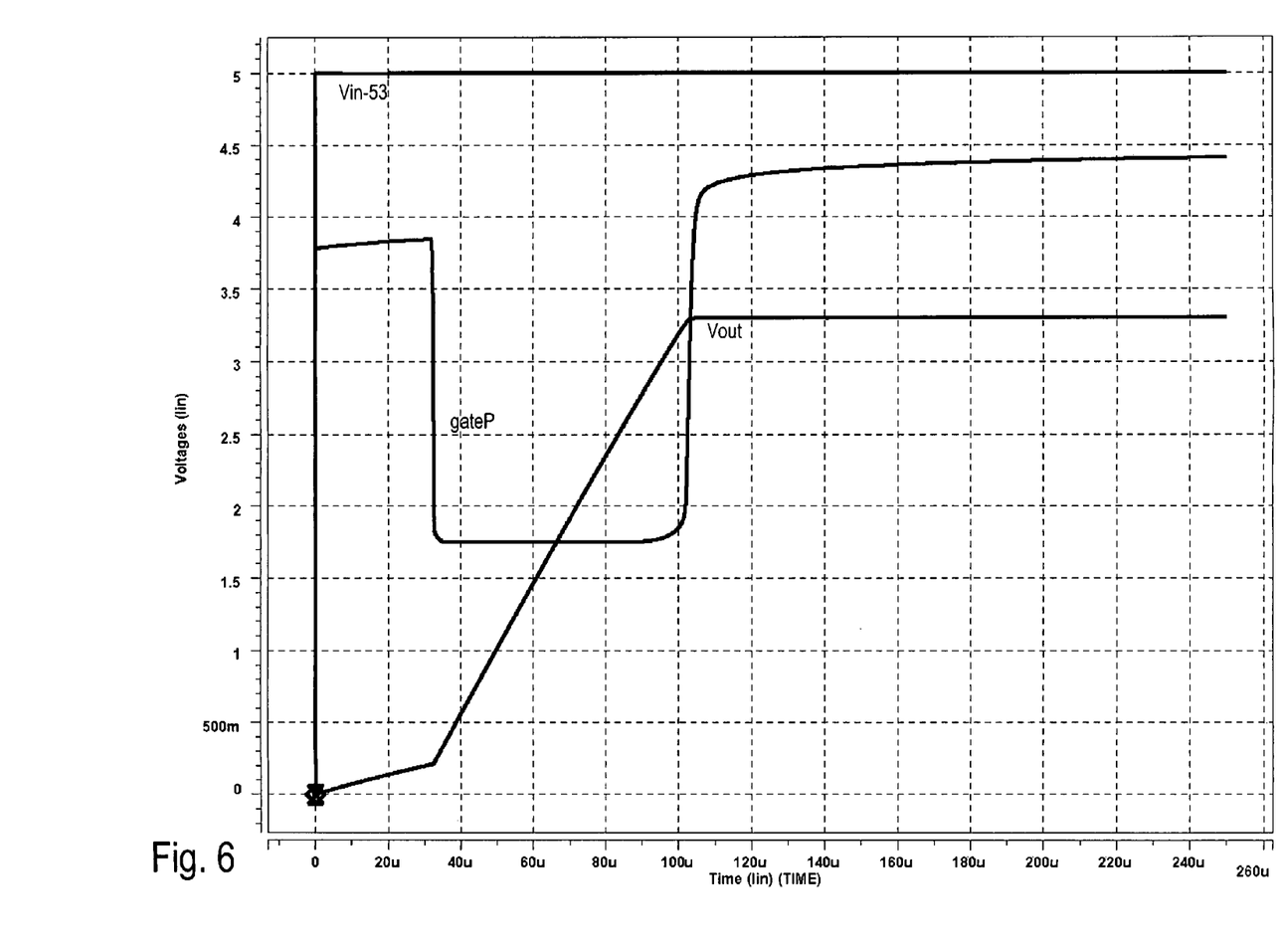
FIG. 6 is a simulation similar to FIG. 3 showing the effect of removing the gate-drain protection of the output device.

FIGS. 5 and 6 illustrate the effect of removing transistors N6 or N8 and P7, respectively. As shown in FIG. 5, if N6 is missing, when Vin_53 is provided, the voltage across the gate and source of P2 will initially be on the order of over 4 volts or mor until the load on Vout stabilizes. The voltage difference between the two extremes of gate P could damage the output transistor T2. Likewise, in FIG. 6, were N8 and P7 are removed, gateP can rise too quickly with Vin_53 and the difference between the gate node of P2 and the drain of P2 could exceed the maximum rated voltage in the transistor thereby damaging the transistor.

Like all other devices in the circuit, the devices N8, P7 and N6 are low voltage transistors protected from large voltages across their interfaces. N6 has a gate which is protected because it is sitting in the middle having a gate voltage of Vpro2t. N8 is protected because its drain is connected to N6 and its gate is also in the middle being connected to Vprot2. The source of P7 is never higher than 3 volts while the drain is coupled to ground. All resistors used in the device are polysilicone resistors and hence do not need to be protected.

Hence, all elements of the circuit of the present invention are protected from having voltages exceeding their maximum rated voltages either in a punch-through phase, or in a configuration stressing the gate to drain or gate to source coupling of the devices. In this manner, devices will not be damaged.

The invention provides the advantage that the technology which is utilized to fabricate the semiconductor devices in the peripheral device being manufactured for use with a host computer system can be utilized to construct the voltage regulator. Previously, were a voltage regulator requiring a step-down from, for example, 5 volts to 3 volts to be utilized, the voltage regulator would use 5 volt maximum rated voltage devices requiring separate masking and processing steps to fabricate the 5 volt devices along with the 3 volt devices which are utilized to manufacture the peripheral device. In the context of the present invention, the same technology can be utilized. The invention has particular applicability with respect to the use in non-volatile memories where the regulator voltage provided on the same semiconductor substrate as a memory device. However, the regulator is not so limited. The regulator has broad applicability with respect to any technology or in step-down voltage regulator manufactured out of devices having lower tolerances than the input voltage would tend to allow are required.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

We claim:

1. A step down voltage regulator comprising devices designed to operate over a maximum rated voltage lower than the supply voltage, comprising:
    an output regulation device coupled to the supply voltage and an output; and
    an output device protection circuit responsive to the supply voltage and the output to ensure that the maximum rated voltage of the output regulation device is not exceeded, the output device protection circuit including a gate-source protection component.

2. The regulator of claim 1 wherein the gate-source protection component includes an n-channel transistor having a drain coupled to the supply voltage and a source coupled to a gate of the output device.

3. The regulator of claim 1 wherein the output regulation device comprises a p-channel transistor.

4. The regulator of claim 3 wherein the p-channel transistor has an operating maximum rated voltage in a range of 2.7–3.3 volts and the supply voltage is in a range of 4.4–5.25 volts.

5. The regulator of claim 3 wherein the output device protection circuit includes a gate-drain protection component.

6. The regulator of claim 5 wherein the gate-drain protection component includes a gate hold-down circuit limiting the voltage of the gate until the regulator output reaches a minimum voltage.

7. The regulator of claim 6 wherein the minimum voltage is 3.3 volts.

8. The regulator of claim 6 wherein the hold-down circuit includes an output controlled device.

9. The regulator of claim 8 wherein the output controlled device is a p-channel transistor.

10. The regulator of claim 9 wherein the hold-down circuit farther includes an n-channel device coupled to the source of the p-channel device.

11. A voltage regulator supplying an output voltage lower than a supply voltage, comprising:
    an output device designed to operate at a maximum rated voltage lower than the supply voltage; and
    an output device protection circuit regulating a gate voltage of the output device relative to a drain load and a source voltage on the output device so as to not exceed the maximum rated voltage, the output device protection circuit including a gate hold-down circuit limiting the voltage of the gate until the regulator output reaches a minimum voltage.

12. The regulator of claim 11 wherein the hold-down circuit further includes an n-channel device coupled to the source of the p-channel device.

13. The regulator of claim 12 wherein the output device protection circuit includes an n-channel transistor having a drain coupled to the supply voltage and a source coupled to a gate of the output device.

14. The regulator of claim 11 wherein the output device comprises a p-channel transistor.

15. The regulator of claim 14 wherein the p-channel transistor has an operating maximum rated voltage in a range of 2.7–3.3 volts and the supply voltage is in a range of 4.4–5.25 volts.

16. The regulator of claim 11 wherein the minimum voltage is 3.3 volts.

17. The regulator of claim 11 wherein the hold-down circuit includes an device controlled by the output load of the regulator.

18. The regulator of claim 17 wherein the output controlled device is a p-channel transistor.

19. A memory system, comprising:
a controller;
a memory array; and
a voltage regulator including a plurality of devices operating at maximum rated voltages less than a supply voltage and having an output regulation device coupled to the supply voltage and an output, and an output device protection circuit responsive to the supply voltage and the output to ensure that the maximum rated voltage of the output regulation device is not exceeded, the output device protection circuit including a gate-source protection component.

20. A memory system including a control path and a data path to a host device, and receiving a supply voltage from the host device, comprising:
a voltage regulator including
a voltage input coupled to the supply voltage;
an output device operating at a maximum rated voltage less than the supply voltage and coupled to a regulator output; and
a protection circuit coupled to the voltage input and the output device, including an output device gate control, the protection circuit comprising a plurality of output control devices operating at maximum rated voltages less than the voltage provided by the host at the input and including a gate hold-down circuit limiting the voltage of a gate of the output device until the regulator output reaches a minimum voltage.

21. The memory system of claim 20 wherein the minimum voltage is 3.3 volts.

22. The memory system of claim 20 wherein the protection circuit regulates a gate voltage of the output device relative to a regulator output.

23. The memory system of claim 22 wherein the regulator output is the drain of the output device.

24. The memory system of claim 20 wherein the output device comprises a p-channel transistor.

25. The memory system of claim 24 wherein the p-channel transistor has an operating maximum rated voltage in a range of 2.7–3.3 volts and the supply voltage is in a range of 4.4–5.25 volts.

26. The memory system of claim 20 wherein the hold-down circuit includes a device controlled by an output load of the memory system.

27. The memory system of claim 26 wherein the output device is a p-channel transistor.

28. The memory system of claim 26 wherein the hold-down circuit further includes an n-channel device coupled to the source of the p-channel device.

29. The memory system of claim 28 wherein the output device protection circuit includes an n-channel transistor having a drain coupled to the supply voltage and a source coupled to a gate of the output device.

30. A method for operating a voltage regulator in a memory system, comprising:

providing a voltage regulator having an input and an output, and including a plurality of devices operating at a maximum rated voltage less than the voltage provided at the input; and
controlling the gate voltage of the output device responsive to a load on the regulator output, so that the maximum rated voltage is not exceeded, by limiting the gate voltage until the regulator output reaches a minimum voltage.

31. The method of claim 30 wherein the controlling step includes regulating an n-channel device coupled to the source of the p-channel device.

32. The method of claim 30 wherein the output controlled device is a p-channel transistor.

33. The method of 30 wherein said step of controlling includes regulating a gate voltage of the output device relative to a regulator output.

34. The method of claim 33 wherein the regulator output is the drain of the output device.

35. The method of claim 34 wherein the output device has an operating maximum rated voltage in a range of 2.7–3.3 volts and the supply voltage is in a range of 4.4–5.25 volts.

36. The method of claim 30 wherein the minimum voltage is 3.3 volts.

37. The method of claim 30 wherein the controlling step includes controlling a device controlled by the output load of the regulator.

38. A peripheral device for a host system including a voltage regulator circuit, comprising:
a functional component;
a voltage regulator having an supply voltage input and an output;
an output regulation device coupled to the supply voltage and the output; and
an output device protection circuit responsive to the supply voltage and the output to ensure that the maximum rated voltage of the output device is not exceeded, the output device protection circuit including a gate-source protection component.

39. The peripheral device of claim 38 wherein the functional component is a memory system.

40. The peripheral device of claim 39 wherein the memory system is a memory stick.

41. The peripheral device of claim 39 wherein the memory system is a smart media card.

42. The peripheral device of claim 39 wherein the memory system is a secure digital card.

43. The peripheral device of claim 39 wherein the memory system includes a controller and a memory array.

44. The peripheral device of claim 39 wherein the memory system is a pc card.

45. The peripheral device of claim 39 wherein the memory system is compact flash card.

* * * * *